United States Patent
Park et al.

(10) Patent No.: US 10,475,868 B2
(45) Date of Patent: Nov. 12, 2019

(54) FLEXIBLE ORGANIC LIGHT EMITTING DIODE DISPLAY HAVING EDGE BENDING STRUCTURE

(71) Applicant: LG DISPLAY CO., LTD., Seoul (KR)

(72) Inventors: Jaesoo Park, Goyang-si (KR); Dongchae Shin, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/923,792

(22) Filed: Mar. 16, 2018

(65) Prior Publication Data

US 2018/0204896 A1  Jul. 19, 2018

Related U.S. Application Data

(63) Continuation of application No. 15/385,430, filed on Dec. 20, 2016, now Pat. No. 9,954,043.

(30) Foreign Application Priority Data

Dec. 30, 2015  (KR) .......................... 10-2015-0189675

(51) Int. Cl.
*H01L 27/32* (2006.01)
*H01L 51/00* (2006.01)

(52) U.S. Cl.
CPC ...... *H01L 27/3258* (2013.01); *H01L 27/3262* (2013.01); *H01L 27/3272* (2013.01); *H01L 27/3276* (2013.01); *H01L 51/0097* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 9,793,334 B2 | 10/2017 | Park et al. | |
| 9,818,764 B2 | 11/2017 | Kwon et al. | |
| 2004/0124763 A1 | 7/2004 | Nathan et al. | |
| 2007/0152222 A1 | 7/2007 | Joo | |
| 2007/0296333 A1 | 12/2007 | Kim et al. | |
| 2011/0001146 A1 | 1/2011 | Yamazaki et al. | |
| 2014/0353670 A1* | 12/2014 | Youn | H01L 27/124 257/72 |
| 2015/0036299 A1 | 2/2015 | Namkung et al. | |
| 2015/0060778 A1 | 3/2015 | Kim et al. | |

(Continued)

*Primary Examiner* — Shaun M Campbell
(74) *Attorney, Agent, or Firm* — Birch, Stewart, Kolasch & Birch, LLP (57) ABSTRACT

A flexible display device according to an embodiment includes a flexible plate including a display area, a non-display area surrounding the display area, an edge bending area near the display area in the non-display area and a pad area extending from the edge bending area; a first thin film transistor in the display area on the flexible plate; a first line disposed in the edge bending area on the flexible plate; a first buffer layer covering the first line; a second line on the first buffer layer in the edge bending area; a second buffer layer covering the second line; a connecting electrode is electrically connected the first line and the second line in the edge bending area; and a plurality of trenches disposed at the edge bending area and penetrating the second buffer layer and the first buffer layer.

16 Claims, 7 Drawing Sheets

(56) References Cited

U.S. PATENT DOCUMENTS

| | | | |
|---|---|---|---|
| 2015/0144922 A1* | 5/2015 | Moon | H01L 27/3279 |
| | | | 257/40 |
| 2015/0187845 A1* | 7/2015 | Kim | H01L 27/323 |
| | | | 257/40 |
| 2015/0205154 A1 | 7/2015 | Koo et al. | |
| 2016/0064421 A1 | 3/2016 | Oh et al. | |

* cited by examiner

Related Art

FLEXIBLE ORGANIC LIGHT EMITTING DIODE DISPLAY HAVING EDGE BENDING STRUCTURE

CROSS REFERENCE TO RELATED APPLICATIONS

This application is a Continuation of U.S. application Ser. No. 15/385,430, filed on Dec. 20, 2016, which claims the benefit of Korea Patent Application No. 10-2015-0189675 filed on Dec. 30, 2015, which are incorporated herein by reference for all purposes as if fully set forth herein.

BACKGROUND OF THE INVENTION

Field of the Invention

The present disclosure relates to a flexible flat panel display. Especially, the present disclosure relates to a flexible organic light emitting diode display having edge bending structure.

Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

Figure 1:
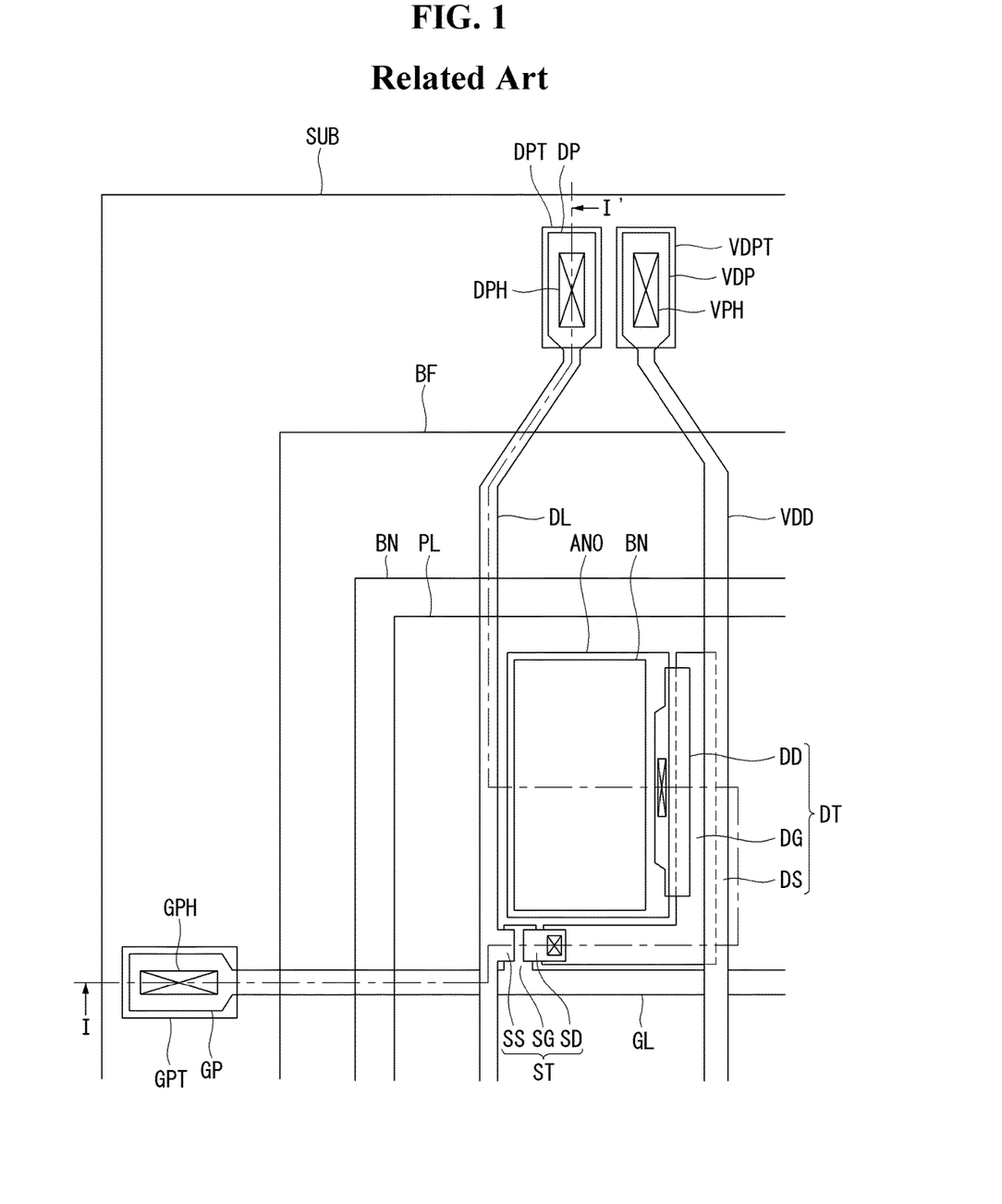
FIG. 1 is a plane view illustrating the structure of an organic light emitting diode display having active switching elements such as thin film transistors according to the related art.
Figure 2:
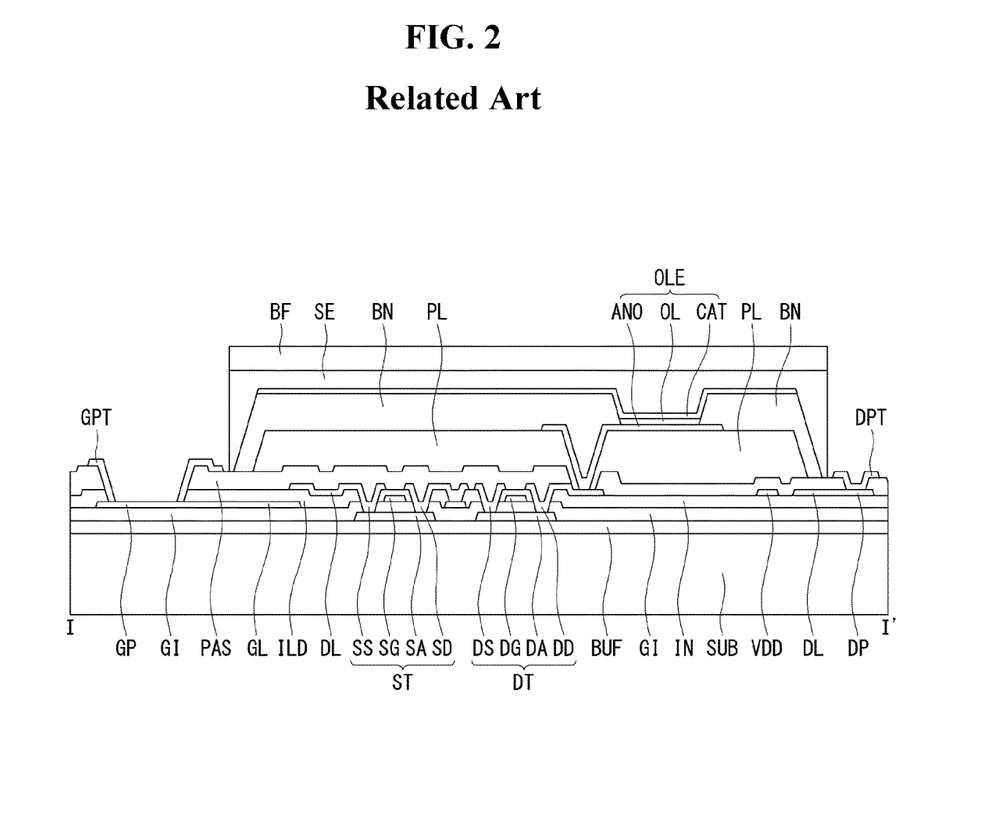
FIG. 2 is a cross sectional view illustrating the structure of the organic light emitting diode display along the cutting line of I-I' in FIG. 1 according to the related art.

FIG. 1 is a plane view illustrating the structure of the organic light emitting diode display having the active switching elements such as the thin film transistors according to the related art. FIG. 2 is a cross sectional view illustrating the structure of the organic light emitting diode display along to the cutting line of I-I' in FIG. 1 according to the related art.

Referring to FIGS. 1 and 2, the organic light emitting diode display comprises a thin film transistor (or 'TFT') substrate having the thin film transistors ST and DT and an organic light emitting diode OLE connected to and driven by the thin film transistors ST and DT, and a barrier film BF joining and facing the thin film transistor substrate with a sealant SE therebetween. The thin film transistor substrate includes a switching thin film transistor ST, a driving thin film transistor DT connected to the switching thin film transistor ST, and an organic light emitting diode OLE connected to the driving thin film transistor DT.

On a transparent substrate SUB, the switching thin film transistor ST is formed where a gate line GL and a data line DL are crossing each other. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE.

As one example, FIG. 2 shows the thin film transistor of top gate structure. In this case, the semiconductor channel layers SA and DA of the switching thin film transistor ST and the driving thin film transistor DT are firstly formed on the substrate SUB and the gate insulating layer GI covers them and then the gate electrodes SG and DG are formed thereon by overlapping with the center portion of the semiconductor channel layers SA and DA. After that, at both sides of the semiconductor channel layers SA and DA, the source electrodes SS and DS and the drain electrodes SD and DD are connected thereto through contact holes penetrating an insulating layer IN. The source electrodes SS and DS and the drain electrodes SD and DD are formed on the insulating layer IN.

In addition, at the outer area of the substrate SUB surrounding the display area where the pixel area is disposed, a gate pad GP formed at one end of the gate line GL, a data pad DP formed at one end of the data line DL, and a driving current pad VDP formed at one end of the driving current line VDD are arrayed. As the gate pad GP is disposed at the different layer from the data pad DP, some defects may occur at the overlapping portion due to the level difference.

A passivation layer PAS is disposed to cover the upper entire surface of the substrate SUB having the switching and the driving thin film transistors ST and DT. After that, formed are the contact holes exposing the gate pad GP, the data pad DP, the driving current pad VDP and the drain electrode DD of the driving thin film transistor DD. Over the display area within the substrate SUB, a planar layer PL is coated. Patterning the planar layer PL, a contact hole is formed for exposing the drain electrode DD of the driving thin film transistor DT. Further, the planar layer PL is patterned as exposing the full areas of the pads at gate pad GP and the data pad DP. The planar layer PL makes the roughness of the upper surface of the substrate SUB in much smoother condition, for coating the organic materials composing the organic light emitting diode on the smooth and planar surface condition of the substrate SUB.

On the planar layer PL, the anode electrode ANO is formed to connect the drain electrode DD of the driving thin film transistor DT through one of the contact holes. On the other hands, at the outer area of the display area not having the planar layer PL, formed are a gate pad electrode GPT, a data pad electrode DPT and a driving current electrode VDPT connected to the gate pad GP, the data pad DP and the driving current pad VDP, respectively, exposed through the contact holes. On the substrate SUB, a bank BN is formed covering the display area, excepting the pixel area.

After completing the thin film transistor substrate, an inorganic material such as the silicon nitride (SiNx) is deposited over the entire surface of the substrate SUB with a thickness of 1~3 μm for preventing the organic light emitting diode from the invasion of the moisture or oxygen gas. Further, a sealant SE is disposed on the inner surface of the barrier film. It is preferable that the sealant SE has the boundary being apart with a predetermined distance from the edges of the barrier plate BF to the inside.

Aligning the barrier plate BF on the thin film transistor substrate, the barrier plate BF is attached/joined with the thin film transistor substrate under pressure. After hardening the sealant SE between the barrier film and the thin film transistor substrate, and then releasing the pressure, the thin film transistor substrate has the surface sealing structure by the barrier plate BF with the sealant SE. It is preferable that the barrier plate BF is a film including plastic or organic material.

It is preferable that the sealant SE and the barrier plate BF covers most of all surface of the thin film substrate without the pad area because the pads would be connected to exterior devices. As exposed at outside, the gate pad GP, the gate pad terminal GPT, the data pad GP and the data pad terminal DPT would be connected to the exterior devices through a connecting means.

According to the relative art, the organic light emitting diode display is formed on a rigid substrate SUB. AS the substrate SUB having the rigid property, it is proper to apply for the monitor, television set or portable display module. However, in the market, more various types of the display are required.

For example, the needs for the flexible display freely bendable or foldable are increasing. Further, the needs for the non-bezel or the narrow bezel display are also increasing, by bending or folding the non display area (on which the display information is not shown) over the lateral sides or rear side. In order to develop these various style displays, it is required that the flexible display that the display elements is formed on the flexible substrate.

SUMMARY OF THE INVENTION

In order to overcome the above-mentioned drawbacks, the purpose of the present disclosure is to suggest a flexible display in which the display function is maintained even it is freely bend or folded. Another purpose of the present disclosure is to suggest a flexible display in which the non-display area is moved behind the lateral side of the rear side by bending the boundary between the display area display area and the non-display area. Still another purpose of the present disclosure is to suggest a flexible display in which the display elements are not damaged by the bending stress occurred at the bending portions defined at the boundary of the display area and the non-display area.

In order to accomplish the above purpose, the present disclosure suggests a flexible display device comprising: a flexible plate including a display area, a non-display area surrounding the display area, an edge bending area near the display area in the non-display area and a pad area extending from the edge bending area; a first thin film transistor in the display area on the flexible plate; a first line disposed in the edge bending area on the flexible plate; a first buffer layer covering the first line; a second line on the first buffer layer in the edge bending area; a second buffer layer covering the second line; a connecting electrode is electrically connected the first line and the second line in the edge bending area; and a plurality of trenches disposed at the edge bending area and penetrating the second buffer layer and the first buffer layer, wherein the plurality of trenches are selectively formed in the non-display area, wherein a first electrode of the first thin film transistor is electrically connected to a first metal electrode in the display area, and wherein a second electrode of the first thin film transistor is electrically connected to a second metal electrode in the display area.

In one embodiment, the first metal electrode disposed at a same layer and including a same material with the first line in the display area, the second metal electrode disposed at a same layer and including a same material with the second line in the display area.

In one embodiment, the flexible display device further comprises gate elements disposed on the second buffer layer; an intermediate insulating layer covering the gate elements; and data elements disposed on the intermediate insulating layer, the second buffer layer and the first buffer layer, wherein the data elements includes a same material with the connecting electrode.

In one embodiment, the gate elements includes a gate pad disposed in the non-display area; a gate line extended from the gate pad over the display area; and a gate electrode extruded from the gate line in the display area, and the data elements includes: a data pad disposed in the non-display area; a data line extended from the data pad over the display area; a source electrode extruded from the data line in the display area; a drain electrode facing with the source electrode; and a gate pad terminal contacting the gate pad.

In one embodiment, the organic light emitting diode display device further comprises a semiconductor layer overlapping with middle portions of the gate electrode on the second buffer layer and under the gate electrode; and a gate insulating layer covering entire surface of the second buffer layer between the semiconductor layer and the gate electrode, wherein the trench penetrating the intermediate insulating layer, the gate insulating layer, the second buffer layer and the first buffer layer.

In some embodiments, the organic light emitting diode display device further comprises a semiconductor layer overlapping with middle portions of the gate electrode on the second buffer layer and under the gate electrode; and a gate insulating layer having a same shape with the gate electrode between the semiconductor layer and the gate electrode, wherein the trench penetrating the intermediate insulating layer, the second buffer layer and the first buffer layer.

In some embodiments, the organic light emitting diode display device further comprises: an organic layer directly contacting entire of a surface of the flexible plate; a multi-buffer layer directly contacting entire of a surfaces of the organic layer; and a gate insulating layer deposited on the multi-buffer layer, wherein the trench exposing some of the organic layer by penetrating the intermediate insulating layer, the gate insulating layer, the second buffer layer, the first buffer layer and the multi-buffer layer.

In some embodiments, the organic light emitting diode display device further comprises an organic layer directly contacting entire of a surface of the flexible plate; and a multi-buffer layer directly contacting entire of a surfaces of the organic layer, wherein the trench exposing some of the organic layer by penetrating the intermediate insulating layer, the second buffer layer, the first buffer layer and the multi-buffer layer.

In some embodiments, at least a portion of the non-display area is disposed behind one of a lateral side and a rear side of the display area by bending the edge bending area.

In some embodiments, the first metal electrode is overlapped with the second metal electrode in the display area.

In some embodiments, an additional storage capacitance is formed between the first metal electrode the second metal electrode in the display area.

Further, the present disclosure suggests a flexible display device comprising: a flexible plate including a display area, a non-display area surrounding the display area, an edge bending area near the display area in the non-display area and a pad area extending from the edge bending area; a first thin film transistor in the display area on the flexible plate; a first line disposed in the edge bending area on the flexible plate; a first buffer layer covering the first line; a second line on the first buffer layer in the edge bending area; a second buffer layer covering the second line; an intermediate insulating layer on the second buffer layer; a connecting electrode is electrically connected the first line and the second line in the edge bending area; and a plurality of trenches disposed at the edge bending area and penetrating at least one of the intermediate insulating layer , the second buffer layer and the first buffer layer, wherein the plurality of trenches are selectively formed in the non-display area.

In some embodiments, a first electrode of the first thin film transistor is electrically connected to a first metal electrode in the display area, and a second electrode of the first thin film transistor is electrically connected to a second metal electrode in the display area.

In some embodiments, the first metal electrode disposed at a same layer and including a same material with the first line in the display area, and the second metal electrode disposed at a same layer and including a same material with the second line in the display area.

In some embodiments, at least a portion of the non-display area is disposed behind one of a lateral side and a rear side of the display area by bending the edge bending area.

In some embodiments, the first metal electrode is overlapped with the second metal electrode in the display area.

In some embodiments, an additional storage capacitance is formed between the first metal electrode the second metal electrode in the display area.

As the display elements are disposed on the flexible substrate, the flat panel display according to the present disclosure maintains the display function over all area normally, even though it is freely bent. The flexible organic light emitting diode display includes the trenches formed by eliminating some portions of the layers stacked at the bending portions defined at the boundary between the display area and the non-display area. Therefore, the bending stress can be reduced or weaken at the bending portions so that the elements are not damaged. As the most pad areas have the similar or same stack structure, the damages due to the stack difference structure can be prevented. Further, as the trenches can be formed by single etching process, the manufacturing process can be simplified.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Referring to attached figures, preferred embodiments of the present disclosure will be explained. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

<First Embodiment>

Figure 3:
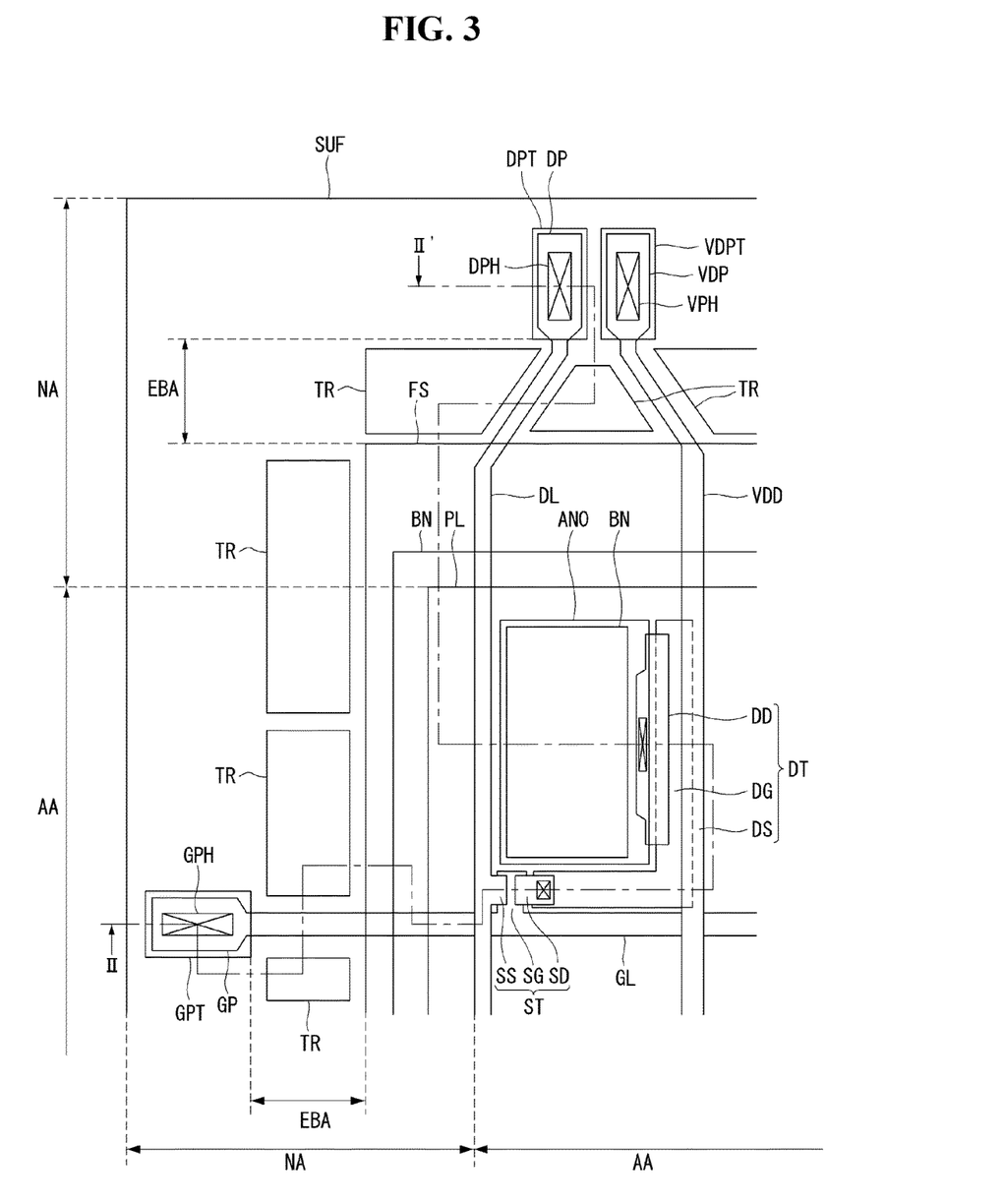
FIG. 3 is a plane view illustrating a structure of a flexible organic light emitting diode display having an edge bending structure according to the present disclosure.
Figure 4A:
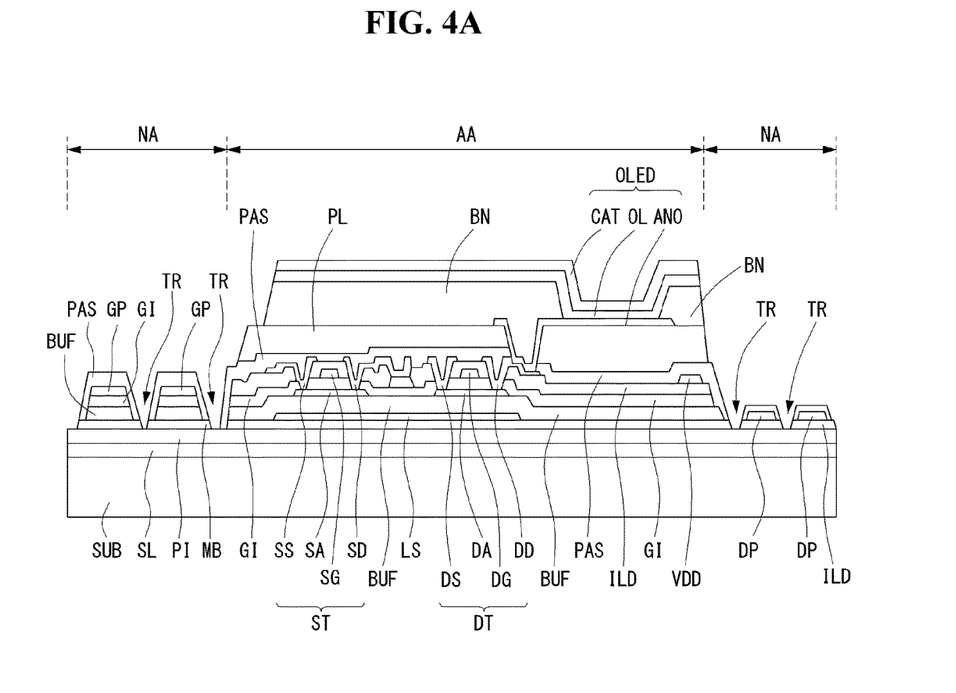
FIGS. 4A and 4B are cross sectional views illustrating the structure of a flexible organic light emitting diode display having an edge bending structure along the cutting line of II-II' in FIG. 3, according to a first embodiment of the present disclosure.
Figure 4B:
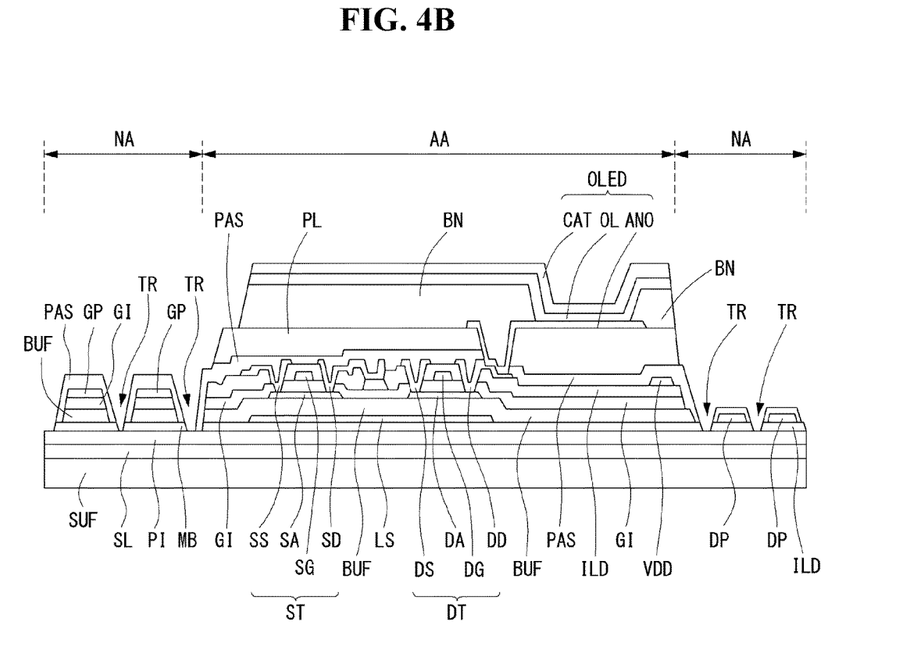

Referring to FIGS. 3, 4A and 4B, the first embodiment of the present disclosure will be explained. FIG. 3 is a plane view illustrating a structure of a flexible organic light emitting diode display having an edge bending structure according to the present disclosure. FIGS. 4A and 4B are cross sectional views illustrating the structure of a flexible organic light emitting diode display having an edge bending structure along the cutting line of II-II' in FIG. 3, according to the first embodiment of the present disclosure.

The flexible organic light emitting diode display according to the first embodiment of the present disclosure comprises a thin film transistor substrate on which thin film transistors ST and DT and an organic light emitting diode OLE driven by the thin film transistors ST and DT are formed. Further, a barrier plate attached on the thin film transistor substrate by a sealant may be included. The sealant and the barrier plate are not duplicately explained because they may be similar with those of the related art.

The flexible organic light emitting diode display comprises a flexible plate SUF not the rigid substrate and display elements disposed on the flexible plate SUF. The flexible plate SUF includes a display area AA and a non-display area NA. The display area AA is defined at the most middle portions of the flexible plate SUF. The non-display area NA surrounds the display area AA. For example, the non-display area NA may be defined at the all four lateral sides of the flexible plate SUF, as fully surrounding the display area AA. Otherwise, only the upper side and the left side of the flexible plate SUF are defined the non-display areas NA. In some cases, any one side or parallel two sides may be defined as the non-display area NA.

The non-display area NA includes pads GP and DP for receiving the signals from the exterior devices. There are some dummy areas between the pads GP and DP and the display area AA. These areas are also included into the non-display area NA, where the lines DL, VDD and GL are disposed. By bending the non-display area NA behind the rear side, the present disclosure suggests a display that only the display area is recognized by the observer when seeing the display at just front side. Specifically, the pads GP and DP are bent over the rear side of the display area AA.

To do so, the dummy area of the non-display area NA excluding the pads GP and DP would be easily bendable. This dummy area is defined as an edge bending area (or a bending portion) EBA. At the edge bending area, a plurality of the trenches TR are disposed for easy bending of the flexible plate SUF. The trench TR is formed where only the insulating layers among the various layers stacked on the flexible plate SUF are sequentially stacked. The trench TR has a well shape (or a sunken-down portion) by selectively removing some of the stacked insulating layers.

On the flexible plate SUF, the various layers are stacked and patterned, or various insulating layers are sequentially stacked. The stacked insulating layers have different bending stress from the flexible plate SUF. Therefore, as the flexible display is bent repeatedly or it is severely folded, the bending portions may be damaged due to the difference of the stress. As a result, the insulating layers may be peel off and the other layer disposed between the insulating layers may be damaged. By forming a plurality of trenches TR exposing some surface of the flexible plate SUF by removing some of the insulating layers at the edge bending area EBA, the insulating layers can be prevented from being damaged by the stress difference when the bending stresses are applied.

Hereinafter, referring to FIGS. 4A and 4B, the structure of the flexible organic light emitting diode display according to the first embodiment will be explained in detail. For the convenience of the manufacturing for the flexible organic light emitting diode display, at first, the flexible organic light emitting diode display is formed on a rigid substrate SUB. After that, the rigid substrate SUB is dispatched from the flexible organic light emitting diode display. FIG. 4A is a cross sectional view illustrating a structure of the flexible organic light emitting diode display formed on the rigid substrate.

On the entire surface (whole surface) of a rigid substrate SUB, a sacrifice layer SL is deposited. The sacrifice layer SL includes an amorphous silicon (a-Si) material. On the entire surface of the sacrifice layer SL, an organic layer PI is disposed. The organic layer PI includes a polyimide material having superior property (or resistance) to the high temperature. On the entire surface of the organic layer PI, a multi-buffer layer MB is disposed. The multi-buffer layer MB includes a plurality of the insulating layers stacked sequentially. For example, the silicon oxide layers and the silicon nitride layers may be alternatively stacked. Otherwise, the organic layer and the inorganic layer may be alternatively stacked.

On the entire surface of the multi-buffer layer MB, a light shielding layer LS is formed. It is preferable that the light shielding layer LS is selectively formed where the thin film transistor would be disposed. On the entire surface of the substrate SUB having the light shielding layer LS, a buffer layer BUF is disposed. On the buffer layer BUF as overlapping with the light shielding layer LS, a switching thin film transistor ST and a driving thin film transistor DT are disposed.

On the buffer layer BUF, the switching semiconductor layer SA of the switching thin film transistor ST and the driving semiconductor layer DA of the driving thin film transistor DT are firstly formed. On the semiconductor layers SA and DA, a gate insulating layer GI is disposed as covering the entire surface of the substrate SUB. On the gate insulating layer GI, gate electrodes SG and DG are formed as overlapping with the semiconductor layers SA and DA, respectively. For example, the switching gate electrode SG of the switching thin film transistor ST is overlapped with the middle portions of the switching semiconductor layer SA. The driving gate electrode DG of the driving thin film transistor DT is overlapped with the middle portions of the driving semiconductor layer DA.

On the entire surface of the substrate SUB having the gate electrodes SG and DG, an intermediate insulating layer ILD is disposed. On the intermediate insulating layer ILD, source-drain electrodes SS-DD and DS-DD are formed for completing the thin film transistors ST and DT. For example, the switching source electrode SS of the switching thin film transistor ST contacts one side of the switching semiconductor layer SA through a contact hole penetrating the intermediate insulating layer ILD and the gate insulating layer GI. The switching drain electrode SD of the switching thin film transistor ST contacts the other side of the switching semiconductor layer SA through a contact hole penetrating the intermediate insulating layer ILD and the gate insulating layer GI. The driving thin film transistor DT has a driving source electrode DS and a driving drain electrode DD, like the switching thin film transistor ST. The switching drain electrode SD of the switching thin film transistor ST connects to the driving gate electrode DG of the driving thin film transistor DT.

In the non-display area NA, a gate pad GP and a data pad DP are disposed. The gate pad GP is disposed on the multi-buffer layer MB, the buffer layer BUF and the gate insulating layer GI. On the contrary, the data pad DP is disposed on the multi-buffer layer MB and the intermediate insulating layer ILD. The reason for that the gate pad GP has the different stack structure from the data pad DP is that the trenches TR are formed at the edge bending area EBA in the non-display area NA.

For example, the trench TR may have the structure for exposing the organic layer PI. For this, when forming the gate electrodes SG and DG, the gate pad GP is formed at the same time. After depositing the gate insulating layer GI, the trenches TR are formed by patterning the gate insulating layer GI, the buffer layer BUF and the multi-buffer layer MB. At this time, at the non-display area where the data pad DP would be disposed, all layers stacked on the organic layer PI are removed.

After that, the intermediate insulating layer ILD is deposited on the entire surface of the substrate SUB. When forming the source-drain electrodes SS-SD and DS-DD on the intermediate insulating layer ILD, the data line DL, the driving current line VDD and the data pad DP are formed. As the intermediate insulating layer ILD is remained under the data pad DP, the intermediate insulating layer ILD is patterned to form the trench TR. At that time, the intermediate insulating layer ILD covering the gate pad GP is also removed.

On the entire surface of the substrate SUB having the source-drain electrodes SS-SD and DS-Dd, a passivation layer PAS is deposited. Patterning the passivation layer PAS, the pads GP and DP are exposed and the trenches TR are completed. After that, a planar layer PL is deposited on the surface of the substrate SUB. It is preferable that the planar layer PL covers within the display area AA.

By patterning the planar layer PL and the passivation layer PAS, the driving drain electrode DD of the driving thin film transistor DT is exposed. By depositing a conductive material on the planar layer PL and patterning it, an anode electrode ANO is formed as connecting to the driving drain electrode DD of the driving thin film transistor DT.

By disposing a bank material on the planar layer PL having the anode electrode ANO, and patterning it, the emission area is defined on the anode electrode ANO. By depositing an organic light emitting layer OL and the cathode electrode CAT sequentially, an organic light emitting diode OLE is formed.

The organic light emitting diode display as shown in FIG. 4A is still not the flexible organic light emitting diode display, because that the display elements are not on the rigid substrate SUB. To complete the flexible organic light emitting diode display, the sacrifice layer SL should be removed by radiating a laser focusing on the sacrifice layer SL. As a result, the rigid substrate SUB is separated from the organic layer PI. After that, a flexible film or a flexible plate SUF is attached on the bottom surface of the organic layer PI. Then, as shown in FIG. 4B, the flexible organic light emitting diode display is completed.

The flexible organic light emitting diode display according to the first embodiment of the present disclosure includes a plurality of the trenches TR at some area in the non-display area where the lines are not disposed. The trenches TR have the well shape by removing the buffer layers and the insulating layers over the organic layer PI. Bending the edge bending area EBA having the trenches TR, the pads GP and DP can be disposed behind the rear side of the flexible plate SUF.

In the first embodiment, a plurality of trenches TR are disposed for the easiness of the edge bending structure. In the first embodiment, the manufacturing process for the trenches TR has the 2 ~3 mask processes. Therefore, the stack structure of the gate pad GP is different from that of the data pad DP. In this case, the bending stress may still be remained at the edge bending area EBA due to the thick difference. This may cause defects at the elements for the display.

<Second Embodiment>

Figure 5A:
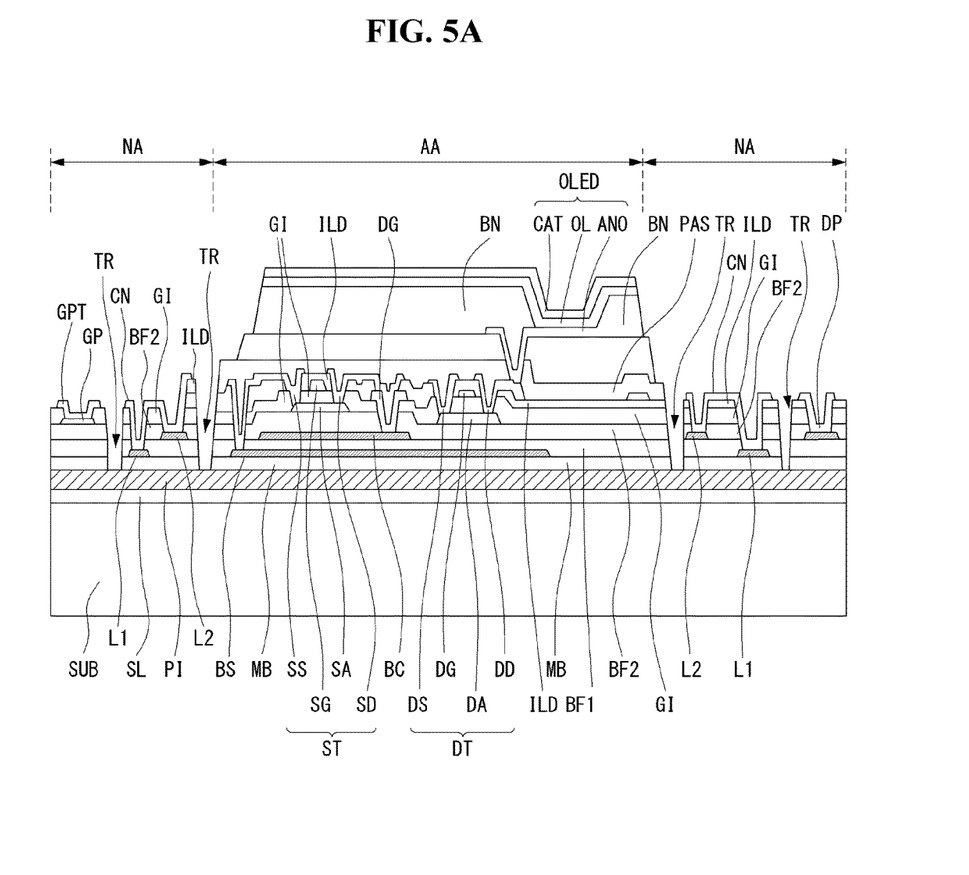
FIGS. 5A and 5B are cross sectional views illustrating the structure of a flexible organic light emitting diode display having an edge bending structure along the cutting line of II-II' in FIG. 3, according to a second embodiment of the present disclosure.
Figure 5B:
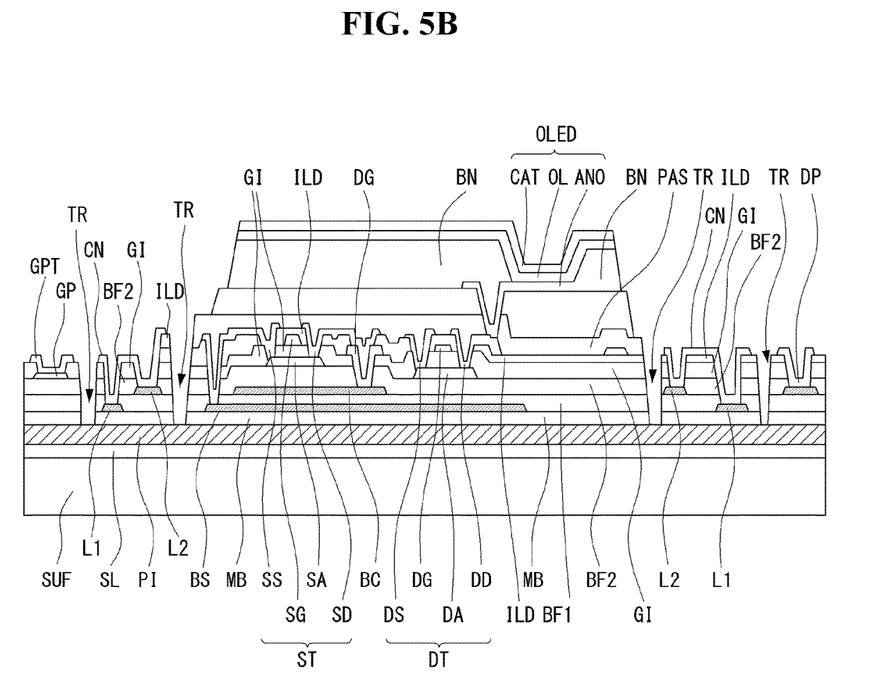

Hereinafter, referring to FIGS. 3, 5A and 5B the second embodiment will be explained. The second embodiment suggests a structure of the flexible organic light emitting diode display in which the defects which may be possibly associated with the first embodiment can be overcome or addressed. Some of the main features of the second embodiment are easily shown in the cross sectional view. Therefore, the structure in the plane view which is the same with the first embodiment will not be duplicated, and FIG. 3 is commonly used for the plane view. FIGS. 5A and 5B are cross sectional views illustrating a structure of a flexible organic light emitting diode display having an edge bending structure along the cutting line of II-II' in FIG. 3, according to the second embodiment of the present disclosure.

For the flexible organic light emitting diode display according to the second embodiment of the present disclosure, at first, the display elements are formed on a rigid substrate SUB, as shown in FIG. 5A. After that, the rigid substrate SUB is dispatched from the display elements to complete the flexible organic light emitting diode display as shown in FIG. 5B.

Referring to FIG. 5A, on the entire surface of a rigid substrate SUB, a sacrifice layer SL is deposited. On the entire surface of the sacrifice layer SL, an organic layer PI is disposed. The organic layer PI includes a polyimide film having superior property (or resistance) to the high temperature.

On the entire surface of the organic layer PI, a multi-buffer layer MB is disposed. The multi-buffer layer MB includes a plurality of the inorganic insulating layers stacked sequentially. For example, the silicon oxide layers and the silicon nitride layers may be alternatively stacked. Otherwise, the organic layer and the inorganic layer may be alternatively stacked. The multi-buffer layer MB is for preventing the moisture or gases from intruding into the display elements disposed thereon.

On the entire surface of the multi-buffer layer MB, a light shielding layer BS is formed. It is preferable that the light shielding layer BS is selectively formed where the thin film transistor would be disposed. Including an opaque metal material, the light shielding layer BS is also used for forming an additional storage. Further, disposing in the non-display area NA, the light shielding layer BS is used for a linker for linking the pad to the line, in the non-display area. For example, a plurality of the connecting electrodes CN for linking the lines disposed on the different layers may be disposed in the non-display area NA. Using the opaque metal material for the light shielding layer BS is also used for a first line L1 linking to the connecting electrode CN.

On the light shielding layer BS, a first buffer layer BF1 is deposited as covering the entire surface of the substrate SUB. The first buffer layer BF1 is for physically and electrically isolating the light shielding layer BS from other conductive layer. Further, the first buffer layer BF1 is used for making the top surface of the substrate SUB in a smooth plane. On the first buffer layer BF1, a storage electrode BC is formed.

It is preferable that the storage electrode BC is disposed as overlapping with the light shielding layer BS. That is, at the portions of the first buffer layer BF1 between the light shielding layer BS and the storage electrode BC, the additional storage is formed. To complete the additional storage, the light shielding layer BS may be connected to the switching source electrode SS of the switching thin film transistor ST, and the storage electrode BC may be connected to the driving gate electrode DG of the driving thin film transistor DT.

In addition, disposed in the non-display area AA, the material of the storage electrode BC is also used for a linker for linking the line and the pad. For example, a plurality of the connecting electrodes CN for linking the lines on the different layers may be disposed in the non-display area NA. Using the opaque metal material for the storage electrode BC is also used for a second line L2 linking to the connecting electrode CN.

On the storage electrode BC, a second buffer layer BF2 is deposited as covering the entire surface of the substrate SUB. The second buffer layer BF2 is for physically and electrically isolating the storage electrode BC from other conductive layer. On the second buffer layer BF2, a switching thin film transistor ST and a driving thin film transistor DT are formed.

On the second buffer layer BF2, a switching semiconductor layer SA of the switching thin film transistor ST and a driving semiconductor layer DA of the driving thin film transistor DT are disposed. On the semiconductor layers SA and DA, a gate insulating layer GI is disposed. On the gate insulating layer GI, the gate elements are formed. The gate elements include a gate line GL, gate electrodes SG and DG, and a gate pad GP. In the case that the driving gate electrode DG is connected to the storage electrode BC, before forming the gate elements, some of the storage electrode BC is exposed by patterning the gate insulating layer GI and the second buffer layer BF2.

The switching gate electrode SG of the switching thin film transistor ST is overlapping with the middle portions of the switching semiconductor layer SA having the gate insulating layer therebetween. The driving gate electrode DG of the driving thin film transistor DT is overlapping with the middle portions of the driving semiconductor layer DA having the gate insulating layer therebetween. The gate line GL is connected to the switching gate electrode SG of the switching thin film transistor ST. The gate pad GP is disposed at one end of the gate line GL. The gate signal applied to the gate pad GP is supplied to the switching gate electrode SG of the switching thin film transistor ST through the gate line GL.

On the gate elements, an intermediate insulating layer ILD is disposed as covering the entire surface of the substrate SUB. The intermediate insulating layer ILD is for isolating the gate elements from the other conductive layer disposed at the other layer physically and electrically. On the intermediate insulating layer ILD, the data elements are formed. Some of data elements may be connected to other elements disposed under the intermediate insulating layer ILD. By patterning the intermediate insulating layer ILD and the gate insulating layer GI, the contact holes are formed. For example, both sides of the semiconductor layers SA and DA are exposed. At the same time, the driving gate electrode DG of the driving thin film transistor DT is exposed. Further, the gate pad GP is exposed.

When patterning the intermediate insulating layer ILD and/or the gate insulating layer GI, at the non-display area NA, some portions of the first line L1 including the same material with the light shielding layer BS and some portions of the second line L2 including the same material with the storage electrode BC may be exposed. These contact holes are for connecting the first line L1 to the second line L2, lately.

On the intermediate insulating layer ILD having the contact holes, by depositing a metal material and patterning it, the data elements are formed. The data elements include a switching source electrode SS and a switching drain electrode SD of the switching thin film transistor ST, a driving source electrode DS and a driving drain electrode DD of the driving thin film transistor DT, a data line DL, a data pad DP, a driving current line VDD and a driving pad VDP.

The switching source electrode SS of the switching thin film transistor ST contacts one side of the switching semiconductor layer SA and the switching drain electrode SD contacts the other side of the switching semiconductor layer SA. The switching drain electrode SD is connected to the driving gate electrode DG The data line DL is connected to the switching source electrode SS of the switching thin film transistor ST. The data pad DP is disposed at one end of the data line DL. The driving source electrode DS of the driving thin film transistor DT contacts one side of the driving semiconductor layer DA and the driving drain electrode DD contacts the other side of the driving semiconductor layer DA. The driving current line VDD is connected to the driving source electrode DS of the driving thin film transistor DT. The driving pad VDP is disposed at one end of the driving current line VDD.

In some cases, the switching source electrode SS is connected to the light shielding layer BS. In the case that the storage electrode BC overlapping with the light shielding layer BS is connected to the driving gate electrode DG, the additional storage capacitance is formed between the light shielding layer BS and the storage electrode BC.

In the non-display area NA, the data pad DP at the one end of the data line DL and the driving pad VDP at the one end of the driving current line VDD are disposed. The data elements further include a gate pad terminal GPT contacting the gate pad GP. Further, the data elements include the connecting electrodes CN in the non-display area NA. The connecting electrode CN connects the first line L1 made of the same material with the light shielding layer BS and the second line L2 made of the same material with the storage electrode BC, via the contact hole.

On the entire surface of the substrate SUB having the data elements, a passivation layer PAS is deposited. Patterning the passivation layer PAS, some portions of the date elements are exposed. At the same time, a plurality of trenches TR are formed. For example, in the non-display area NA, the passivation layer PAS is patterned to expose some portions of the data elements. By etching the passivation layer PAS, the intermediate insulating layer ILD, the gate insulating layer GI, the second buffer layer BF2, the first buffer layer BF1 and the multi-buffer layer MB sequentially, the trenches TR may be formed. It is preferable that the trenches TR are disposed at the edge bending area EBA in the non-display area NA. For example, the trenches TR may be disposed where there are no lines GL and DL between the pad area GP and DP and the display area AA.

After that, a planar layer PL is deposited on the surface of the substrate SUB. It is preferable that the planar layer PL covers within the display area AA. Patterning the planar layer PL and the passivation layer PAS, the driving drain electrode DD of the driving thin film transistor DT is exposed. By depositing a conductive material on the planar layer PL and patterning it, an anode electrode ANO is formed as connecting to the driving drain electrode DD of the driving thin film transistor DT.

By disposing a bank material on the planar layer PL having the anode electrode ANO, and patterning it, the emission area is defined on the anode electrode ANO. By depositing an organic light emitting layer OL and the cathode electrode CAT sequentially, an organic light emitting diode OLE is formed.

The organic light emitting diode display as shown in FIG. 5A is still not the flexible organic light emitting diode display, because that the display elements are not on the rigid substrate SUB. To complete the flexible organic light emitting diode display, the sacrifice layer SL should be removed by radiating a laser focusing on the sacrifice layer SL. As a result, the rigid substrate SUB is separated from the organic layer PI. After that, a flexible film or a flexible plate SUF is attached on the bottom surface of the organic layer PI. Then, as shown in FIG. 5B, the flexible organic light emitting diode display is completed.

In the second embodiment of the present disclosure, using the metal layers used for the light shielding layer BS and the storage electrode BC in the display area AA, the first line L1 and the second line L2 are formed in the non-display area AA. Using the first line L1 and the second line L2, one of the gate elements and one of the data elements are connected each other. In the second embodiment, the gate elements and the data elements have the same stack structure in the non-display area NA.

By selectively removing the stacked insulating layers in the non-display area NA, the trenches TR are formed. The trenches TR are disposed at the edge bending area EBA when the non-display area NA is bent to the rear side of the display area AA. The bending stress may be concentrated at the edge bending area EBA. In the case that various elements are disposed at the edge bending area EBA, they may be easily damaged as bending the non-display area NA. According to the second embodiment, with the trenches TR disposed at the edge bending area EBA, the bending stress can be scattered or reduced. As a result, the damages caused at the edge bending area EBA can be prevented.

Further, as the stack structures of the entire pad area are similar or same, the damages caused by shape difference or level difference can be prevented. In addition, as the trenches TR can be formed by single etching process, the manufacturing process can be minimized.

Until now, the flexible organic light emitting diode display in which the thin film transistors have the top gate structure is explained. However, one or more of the main ideas of the present disclosure can be applied to the organic light emitting diode display having the bottom gate structure thin film transistors. Further, the switching thin film transistor may have the different type from the driving thin film transistor. For example, the switching thin film transistor has the top gate structure, but the driving thin film transistor has the bottom gate structure, or vice versa.

In the above explanations, the gate insulating layer GI covers the entire surface of the substrate on the semiconductor layer. However, the gate insulating layer GI may be patterned with the gate electrode. In that case, the gate insulating layer GI has the same shape with the gate electrode, and disposed on the middle portions of the semiconductor layer overlapping with the gate electrode. In that case, the trenches may have the well structure in which the organic layer is exposed by etching to penetrate the intermediate insulating layer, the second buffer layer, the first buffer layer and the multi-buffer layer.

While the embodiments of the present invention have been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A flexible display device comprising:
   a flexible plate including a display area, a non-display area surrounding the display area, an edge bending area in the non-display area and a pad area extending from the edge bending area;
   a first thin film transistor in the display area on the flexible plate;
   a first line disposed in the edge bending area on the flexible plate;
   a first buffer layer covering the first line;
   a second line on the first buffer layer in the edge bending area;
   a second buffer layer covering the second line;
   a connecting electrode electrically connected to the first line and the second line in the edge bending area;
   a plurality of trenches disposed at the edge bending area and penetrating the second buffer layer and the first buffer layer;
   gate elements disposed on the second buffer layer;
   an intermediate insulating layer covering the gate elements; and
   data elements disposed on the intermediate insulating layer, the second buffer layer and the first buffer layer,
   wherein the data elements include a same material with the connecting electrode,
   wherein the plurality of trenches are selectively formed in the non-display area,
   wherein a first electrode of the first thin film transistor is electrically connected to a first metal electrode in the display area,
   wherein a second electrode of the first thin film transistor is electrically connected to a second metal electrode in the display area, and
   wherein the first and second lines are disposed between two trenches among the plurality of trenches without overlapping with any of the plurality of trenches.

2. The flexible display device according to claim 1, wherein the first metal electrode disposed at a same layer and including a same material with the first line in the display area,
   wherein the second metal electrode disposed at a same layer and including a same material with the second line in the display area.

3. The flexible display device according to claim 1,
   wherein the gate elements include:
   a gate pad disposed in the non-display area;
   a gate line extended from the gate pad over the display area; and
   a gate electrode extruded from the gate line in the display area, and
   wherein the data elements include:
   a data pad disposed in the non-display area;
   a data line extended from the data pad over the display area;
   a source electrode extruded from the data line in the display area;
   a drain electrode facing with the source electrode; and
   a gate pad terminal contacting the gate pad.

4. The flexible display device according to claim 3, further comprising:
   a semiconductor layer overlapping with middle portions of the gate electrode on the second buffer layer and under the gate electrode; and
   a gate insulating layer covering an entire surface of the second buffer layer between the semiconductor layer and the gate electrode,
   wherein the trench penetrates the intermediate insulating layer, the gate insulating layer, the second buffer layer and the first buffer layer.

5. The flexible display device according to claim 3, further comprising:
   a semiconductor layer overlapping with middle portions of the gate electrode on the second buffer layer and under the gate electrode; and
   a gate insulating layer having a same shape with the gate electrode between the semiconductor layer and the gate electrode,
   wherein the trench penetrates the intermediate insulating layer, the second buffer layer and the first buffer layer.

6. The flexible display device according to claim 1, further comprising:
   an organic layer directly contacting an entire surface of the flexible plate;
   a multi-buffer layer directly contacting an entire surface of the organic layer; and
   a gate insulating layer deposited on the multi-buffer layer,
   wherein the trench exposes some of the organic layer by penetrating the intermediate insulating layer, the gate insulating layer, the second buffer layer, the first buffer layer and the multi-buffer layer.

7. The flexible display device according to claim 1, further comprising:
   an organic layer directly contacting an entire surface of the flexible plate; and
   a multi-buffer layer directly contacting an entire surface of the organic layer,
   wherein the trench exposes some of the organic layer by penetrating the intermediate insulating layer, the second buffer layer, the first buffer layer and the multi-buffer layer.

8. The flexible display device according to claim 1, wherein at least a portion of the non-display area is disposed behind one of a lateral side and a rear side of the display area by bending the edge bending area.

9. The flexible display device according to claim 1, wherein the first metal electrode is overlapped with the second metal electrode in the display area.

10. The flexible display device according to claim 9, wherein an additional storage capacitance is formed between the first metal electrode and the second metal electrode in the display area.

11. A flexible display device comprising:
- a flexible plate including a display area, a non-display area surrounding the display area, an edge bending area in the non-display area and a pad area extending from the edge bending area;
- a first thin film transistor in the display area on the flexible plate;
- a first line disposed in the edge bending area on the flexible plate;
- a first buffer layer covering the first line;
- a second line on the first buffer layer in the edge bending area;
- a second buffer layer covering the second line;
- an intermediate insulating layer on the second buffer layer;
- a connecting electrode electrically connected to the first line and the second line in the edge bending area;
- a plurality of trenches disposed at the edge bending area and penetrating at least one of the intermediate insulating layer, the second buffer layer and the first buffer layer;
- gate elements disposed on the second buffer layer;
- an intermediate insulating layer covering the gate elements; and
- data elements disposed on the intermediate insulating layer, the second buffer layer and the first buffer layer,
- wherein the data elements include a same material with the connecting electrode,
- wherein the plurality of trenches are selectively formed in the non-display area, and
- wherein the first and second lines are disposed between two trenches among the plurality of trenches without overlapping with any of the plurality of trenches.

12. The flexible display device according to claim 11, wherein a first electrode of the first thin film transistor is electrically connected to a first metal electrode in the display area, and
- wherein a second electrode of the first thin film transistor is electrically connected to a second metal electrode in the display area.

13. The flexible display device according to claim 12, wherein the first metal electrode disposed at a same layer and including a same material with the first line in the display area, and
- wherein the second metal electrode disposed at a same layer and including a same material with the second line in the display area.

14. The flexible display device according to claim 11, wherein at least a portion of the non-display area is disposed behind one of a lateral side and a rear side of the display area by bending the edge bending area.

15. The flexible display device according to claim 12, wherein the first metal electrode is overlapped with the second metal electrode in the display area.

16. The flexible display device according to claim 15, wherein an additional storage capacitance is formed between the first metal electrode and the second metal electrode in the display area.

* * * * *